United States Patent [19]

Aigo

[11] Patent Number: 5,150,532
[45] Date of Patent: Sep. 29, 1992

[54] LID MEMBER HAVING A FILTER MEDIUM FOR A SPIN DRYER

[76] Inventor: Seiichiro Aigo, 3-15-13, Negishi, Daito-ku, Tokyo, Japan

[21] Appl. No.: 769,796

[22] Filed: Oct. 2, 1991

[30] Foreign Application Priority Data

Oct. 4, 1990 [JP] Japan .................. 2-104050[U]

[51] Int. Cl.$^5$ .............................. F26B 17/24
[52] U.S. Cl. .............................. 34/58; 34/8; 34/187
[58] Field of Search .............. 34/8, 58, 59, 82, 184, 34/186

[56] References Cited

U.S. PATENT DOCUMENTS

| 3,323,223 | 6/1967 | Mercier et al. | 34/58 |
| 3,824,701 | 7/1974 | Norquist | 34/58 |
| 4,512,088 | 4/1985 | Clapper | 34/58 |
| 4,724,619 | 2/1988 | Poli et al. | 34/58 |
| 4,922,625 | 5/1990 | Farmer | 34/58 |
| 5,050,316 | 9/1991 | Aigo | 34/58 |
| 5,083,381 | 1/1992 | Aigo | 34/59 |

Primary Examiner—Henry A. Bennet
Assistant Examiner—Denisel F. Gromada
Attorney, Agent, or Firm—Wegner, Cantor, Mueller & Player

[57] ABSTRACT

A lid member having an annular filter therein is mounted so as to open on a spin dryer body and serves to filter air introduced therein. The lid member has a top surface which is upwardly convex to prevent turbulence of air above the top surface and introduction of air from below, and is divided into upper and lower portions. A gap formed between the upper and lower portions may be opened for introduction of air and closed for stoppage of the introduction of air.

3 Claims, 3 Drawing Sheets

LID MEMBER HAVING A FILTER MEDIUM FOR A SPIN DRYER

BACKGROUND OF THE INVENTION (1) Field of the Invention

The present invention relates to a spin dryer for drying semiconductor materials, and more specifically to an improvement of a lid member having a filter medium to be mounted so as it opens on a spin dryer body.

(2) Description of the prior art

Spin dryers have been used for removing water droplets from semiconductor materials such as silicon wafers after being washed and drying the materials. The body of these spin dryers comprises a rotor to be driven on which semiconductor materials to be dryed are set, and a casing enclosing the rotor. Rotation of the rotor generates air flow into the rotor from thereabove and the air drawn discharges out through an exhaust duct located at the periphery of the casing. Therefore, a lid member which has an air filter medium therein is mounted so as it opens on the spin dryer body in order to filter the air to be drawn into the spin dryer body. The lid member will be opened when semiconductor materials are set into or dismounted from the rotor.

In the prior art, there has been provided a lid member such as shown, for example, in U.S. Pat. No. 5,050,316, which is shown in FIGS. 5 and 6. Such lid member on the spin dryer body comprises a case, an annular filter medium which is called a HEPA filter, a top plate on the filter medium, and a vertically movable lid plate positioned above the top plate. Also, the lid plate is provided with an annular seal attached on the lower face thereof, and bellows are provided between a peripheral wall of the case and an outer periphery of the lid.

When drying semiconductor materials by driving the rotor, the lid plate is elevated to separate the seal from the top plate so as to enable air flow into the rotor, while in stoppage of the rotor the lid plate is lowered by means of an air-cylinder to close the gap provided between the seal and the top plate so as to prevent air from being introduced.

In the conventional lid member which has the lid plate with a flat surface, when the lid member is opened after the operation of the rotor, a negative pressure will occur on the bottom side of the lid member and a turbulence of air will be generated on the top side thereof. Accordingly, air will be drawn from lower side and then introduced into the spin dryer body, which will contaminate semiconductor materials after drying.

SUMMARY OF THE INVENTION

An object of the present invention is to overcome the above mentioned problems of the related art, and therefore to provide an improved lid member having a filter medium therein for a spin dryer, with the said lid member being able to prevent air from being drawn into the spin dryer body from below.

A lid member according to the present invention comprises a filter medium for filtering air and a top convex surface. This top convex surface consists of upper and lower portions, and the upper portion is vertically movable. An actuator is provided to vertically move the upper portion. The elevation of the upper portion forms a gap between the upper and lower portions through which air is introduced. The upper portion is lowered to close the gap so as to prevent air from being introduced.

Since the top surface of the lid member is upwardly convex, air above the lid member will be guided downwardly without any turbulence, when the lid member is pivoted up and opened. Such downward air flow acts to prevent suction of air from below.

DETAILED DESCRIPTION OF THE INVENTION AND PREFERRED EMBODIMENTS

Figure 1:
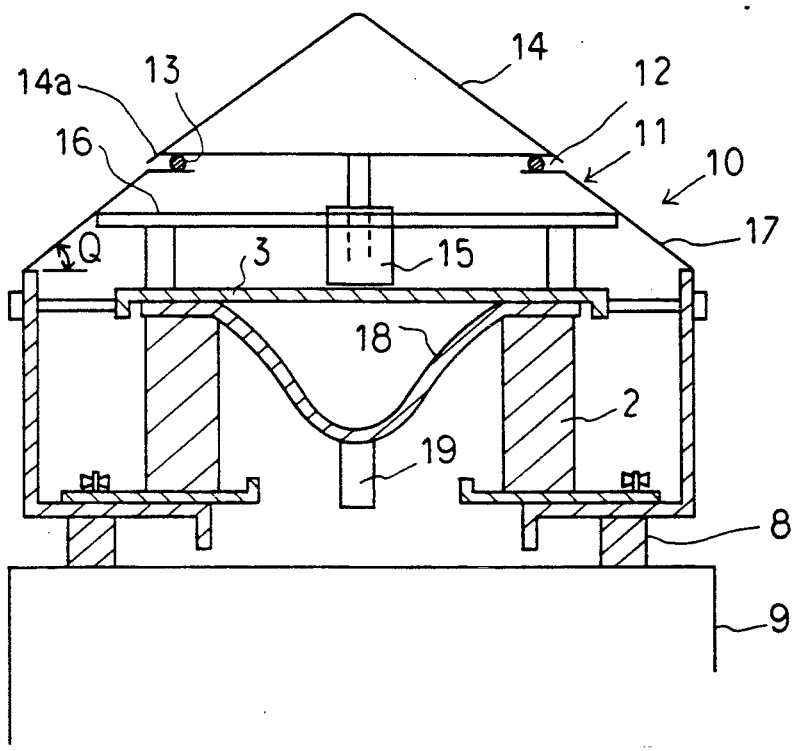
FIG. 1 is a vertical cross sectional view of a lid member for a spin dryer according to the present invention.
Figure 2:
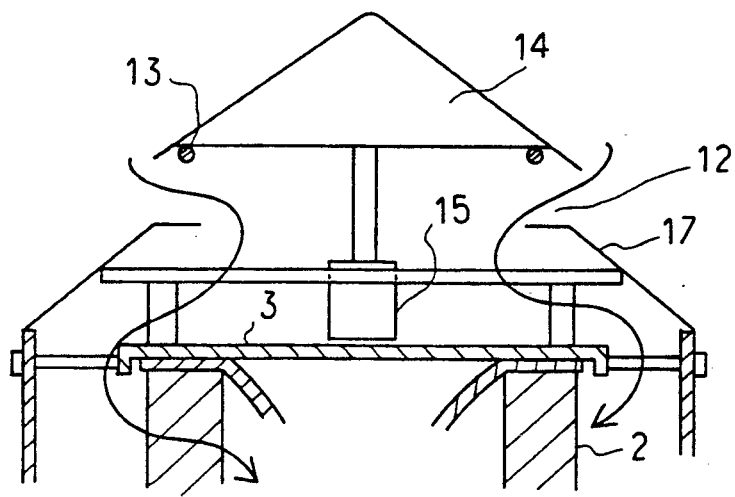
FIG. 2 is a partial vertical cross sectional view of the lid member showing it in operational condition.

The above and other objects, features and advantages of the present invention will become apparent from the following description taken in conjunction with the accompanying drawings. FIGS. 1 and 2 show an embodiment of the invention. As shown in these Figures, lid member 10 of the invention includes an annular filter medium 2 in it and top plate 3 on the filter medium. The lid member 10 is mounted so as to open on a spin dryer body with seal 8 interposed therebetween.

The lid member 10 is characterized by its top surface 11 which is upwardly convex and the surface 11 is divided into upper and lower portions at a suitable level thereof. A gap will be formed at the divided portion 12. The center of the top surface 11 preferably forms an apex thereof, and the top convex form will be a circular cone or a square cone. An inclination ($\theta$) of the convex surface will be, for example, approximately 30 degrees.

Figure 5:
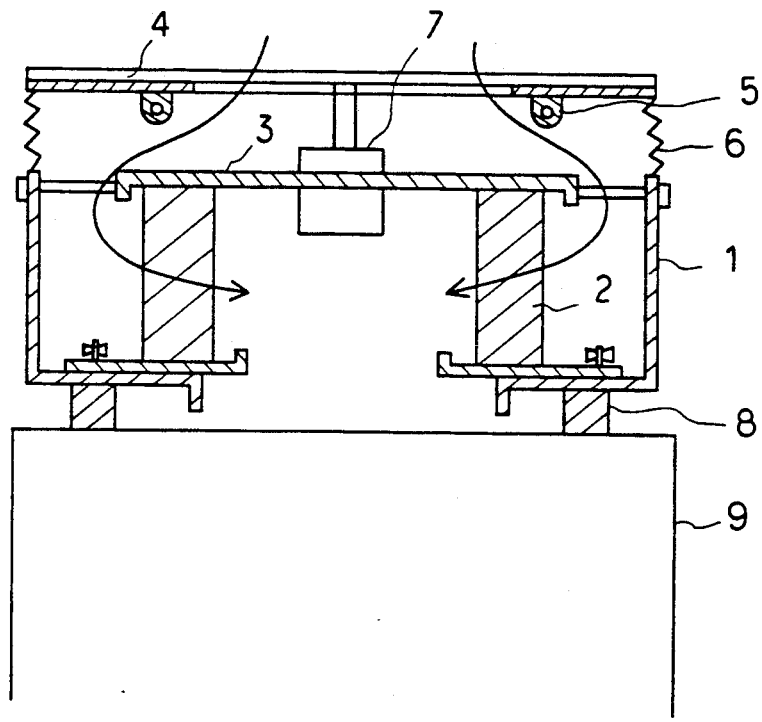
FIG. 5 is a partial vertical cross sectional view showing a prior art lid member for a spin dryer.
Figure 6:
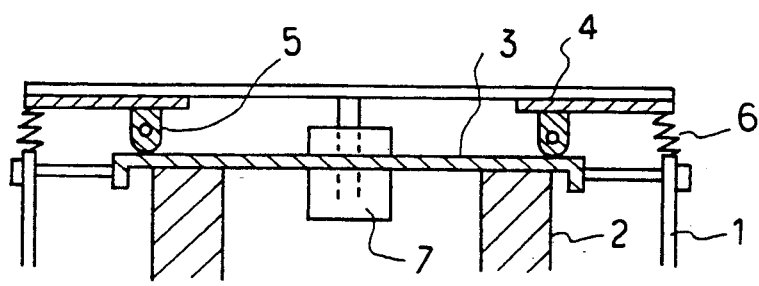
FIG. 6 is a partial vertical cross sectional view of a prior art lid member showing a closed condition.

Also, an annular seal 13 is provided on the divided portion 12 of the top surface 11 to seal the gap between the upper and lower portions. The upper portion 14 is adapted for vertical movement to open or close the divided portion 12. Therefor an actuator is provided which will preferably be an air-cylinder. This actuator is fixed, for example, onto support frame 16 which is supported on top plate 3. The actuating rod of the air-cylinder is attached, at the end thereof, to the upper portion 14. Therefore, the conventional bellows (such as bellows 6 shown in FIGS. 5 and 6) are not needed for this lid member.

Further, the outer peripheral edge 14a of the upper portion 14 is preferably slightly outside of the top peripheral edge of the lower portion 17. As shown in FIG. 1, the bottom surface 18 of the top plate 3 is preferably downwardly convex and a device for removing electrostatic charge, i.e., an ionizer will be mounted on the central lowermost position of the bottom surface 18 enabling it to ionize air introduced into the rotor so as to remove possible electrostatic charge on semiconductor materials.

Figure 3:
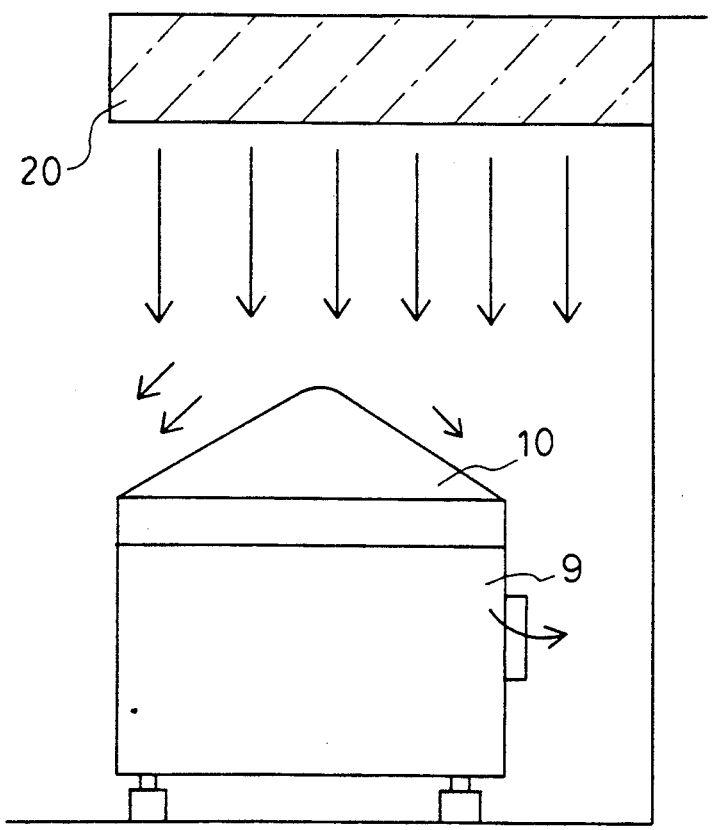
FIG. 3 is an elevational view showing a spin dryer with the lid member of the invention located in a clean room.
Figure 4:
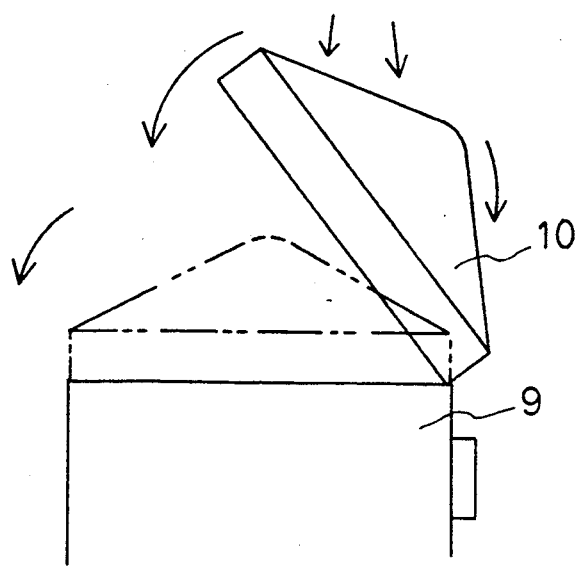
FIG. 4 is an elevational view of a spin dryer with an opened lid member of the invention.

This kind of spin dryer is usually positioned in a clean room and located under a clean air ventilator 20 as shown in FIG. 3. The ventilator directs clean air downwardly to the spin dryer to keep the atmosphere clean around the same.

When the spin dryer is being driven, the upper portion 14 of the lid member 10 is elevated by the air-cylinder 15 to open the divided portion 12 as shown in FIG. 2 and air is introduced down into the spin dryer body 9 through the divided portion 12. It is apparent such a vertical movement of the upper portion 14 can be performed with an electric motor. Also, while the spin dryer is not driven, the upper portion 14 is lowered as shown in FIG. 1 to close the divided portion 12 thereby stopping the introduction of air.

When the lid member 10 is upwardly pivoted after the spin-drying, the top surface 11 will guide air thereabove without any turbulence because of the convex form of the top surface 11. This downward air flow prevents suction of air from the underside into the spin dryer. Since clean air is directed down, air in the upper level is cleaner than that in the lower level in the atmosphere around the spin dryer. And, air in the lower level is not as clean as that in the upper level also because it may include air returning back from the floor surface. Accordingly, it is effective for avoiding contamination of the dryed semiconductor materials to prevent air existing in the lower level from being introduced into the spin dryer body.

As described above, according to the present invention, since the lid member prevents air existing in the lower level from being introduced into the spin dryer when it is opened, the dryed semiconductor materials can be kept clean without contamination with air existing in the underside. Furthermore, our lid member does not need expensive bellows, which therefore leads to a cost reduction for this kind of apparatus.

Having now described the invention, it will be apparent to one of ordinary skill in the art that many changes and modifications can be made thereto without departing from the spirit or scope of the invention as set forth herein.

What is claimed is:

1. A lid member having a filter medium therein mounted on a spin dryer body for filtering air drawn into the spin dryer body, wherein the lid member comprises:

a top convex surface having an upper portion and a lower portion, wherein said upper portion is vertically movable between a closed position and an open position, and wherein a gap through which air can be introduced is formed between said upper portion and said lower portion when said upper portion is in the open position; and actuator means for activating said upper portion so as to open and close said gap.

2. The lid member set forth in claim 1, wherein said top convex surface is formed as a circular cone.

3. The lid member set forth in claim 1, wherein said top convex surface is formed as a square cone.

* * * * *